(12) United States Patent  
Song

(10) Patent No.: US 8,810,304 B2
(45) Date of Patent: Aug. 19, 2014

(54) ADAPTIVE POWER GATING AND REGULATION

(71) Applicant: Intel Corporation, Santa Clara, CA (US)

(72) Inventor: Hongjiang Song, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/630,395

(22) Filed: Sep. 28, 2012

(65) Prior Publication Data

US 2014/0091851 A1   Apr. 3, 2014

(51) Int. Cl.
*G11C 5/14*   (2006.01)

(52) U.S. Cl.
USPC ............................................ 327/530; 327/541

(58) Field of Classification Search
USPC ................... 327/530, 538, 540, 541, 158, 161
See application file for complete search history.

(56) References Cited

U.S. PATENT DOCUMENTS

| | | | | |
|---|---|---|---|---|
| 5,859,563 | A * | 1/1999 | Yung et al. | 327/538 |
| 6,275,079 | B1 * | 8/2001 | Park | 327/143 |
| 6,414,527 | B1 * | 7/2002 | Seno et al. | 327/158 |
| 6,472,929 | B2 * | 10/2002 | Kobayashi et al. | 327/540 |
| 7,170,265 | B2 * | 1/2007 | Whittaker | 323/267 |
| 7,501,868 | B2 * | 3/2009 | Ito | 327/158 |
| 2002/0190283 | A1 | 12/2002 | Seno et al. | |
| 2003/0030483 | A1 | 2/2003 | Seki et al. | |
| 2005/0237105 | A1 * | 10/2005 | Park | 327/539 |
| 2006/0017471 | A1 * | 1/2006 | Nguyen | 327/3 |
| 2008/0136472 | A1 * | 6/2008 | Shor | 327/156 |
| 2010/0164567 | A1 * | 7/2010 | Kim et al. | 327/153 |
| 2011/0291740 | A1 | 12/2011 | Sofer et al. | |

FOREIGN PATENT DOCUMENTS

KR   1020080071819   8/2008
KR   1020080080834   9/2008

OTHER PUBLICATIONS

International Searching Authority, "Notification of Transmittal of the International Search Report and the Written Opinion of the International Searching Authority," mailed Sep. 26, 2013, in International application No. PCT/US2013/047229.

* cited by examiner

*Primary Examiner* — Quan Tra
(74) *Attorney, Agent, or Firm* — Trop, Pruner & Hu, P.C.

(57) ABSTRACT

In one embodiment, an apparatus includes a power switch to provide a local power voltage at least one gated circuit based on a control signal. The apparatus also includes a delay sensor to provide a delay substantially equivalent to a processing delay of the at least one gated circuit. The apparatus also includes a phase detector to provide the control signal based at least in part on the delay.

27 Claims, 14 Drawing Sheets

US 8,810,304 B2

ADAPTIVE POWER GATING AND REGULATION

BACKGROUND

Embodiments relate generally to data interfaces for electronic devices.

Many electronic devices include multiple components coupled together by one or more data interfaces. For example, a cellular telephone may include a processor core coupled to a radio transceiver, a sound input device, a sound output device, a camera, a display device, a memory device, etc. The functionality of such components has been continually improved to meet market demands. Accordingly, the data interfaces between the components may need to be adapted to such functionality.

DETAILED DESCRIPTION

Figure 1:
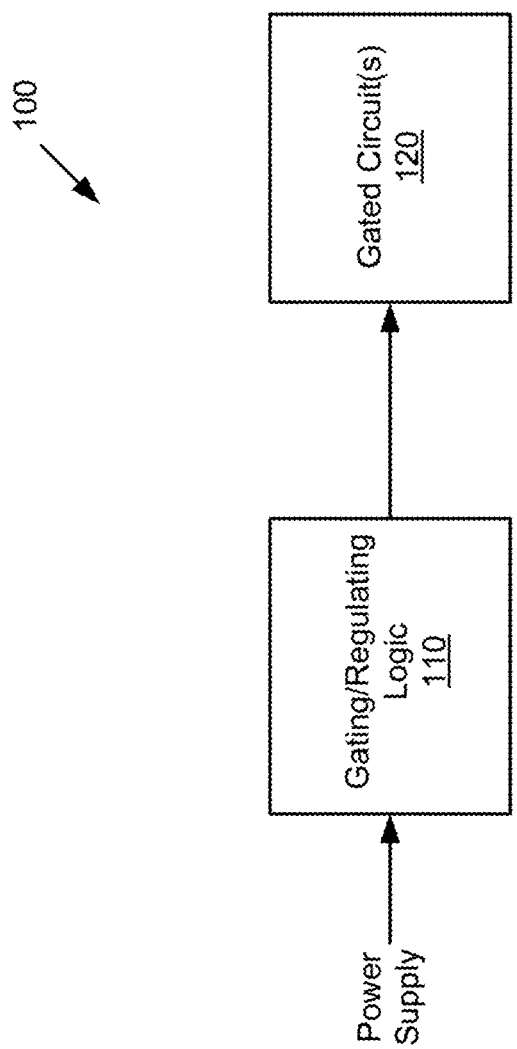
FIG. 1 is a block diagram of a system in accordance with one or more embodiments.

Referring to FIG. 1, shown is a block diagram of an apparatus 100 in accordance with one or more embodiments. As shown in FIG. 1, the apparatus 100 may include a gating/regulating logic 110 and gated circuits 120. In accordance with some embodiments, the apparatus 100 may be all or a portion of any electronic device, such as a cellular telephone, a computer, a media player, a network device, etc. Further, in some embodiments, the gated circuits 120 may include any elements or components of such electronic devices, including processors, memory devices, storage devices, wired and/or wireless data interface components (e.g., receivers, transmitters, etc.), image/video components, sound components, etc.

In accordance with some embodiments, the gating/regulating logic 110 includes functionality for selectively gating a power supply to the gated circuits 120. In some embodiments, such gating enables reduction of power consumption during periods when the gated circuits 120 are not in use. For example, assume that the gated circuits 120 include a radio receiver that is only activated during time periods when inbound transmissions are scheduled. In this example, the gating/regulating logic 110 provides the power supply to the receiver during such time periods, and may switch off the power during the remaining time. In one or more embodiments, the gating/regulating logic 110 further includes functionality to adaptively regulate the power supply voltage to the gated circuits 120. In some embodiments, the power supply voltage may be adjusted based on a delay associated with the gated circuits 120. The functionality of the gating/regulating logic 110 is described further below with reference to FIGS. 2-8.

In one or more embodiments, the gating/regulating logic 110 may be implemented in hardware, software, and/or firmware. In firmware and software embodiments, they may be implemented by computer executed instructions stored in a non-transitory computer readable medium, such as an optical, semiconductor, or magnetic storage device. While shown with this particular implementation in the embodiment of FIG. 1, the scope of the various embodiments discussed herein is not limited in this regard.

Figure 2:
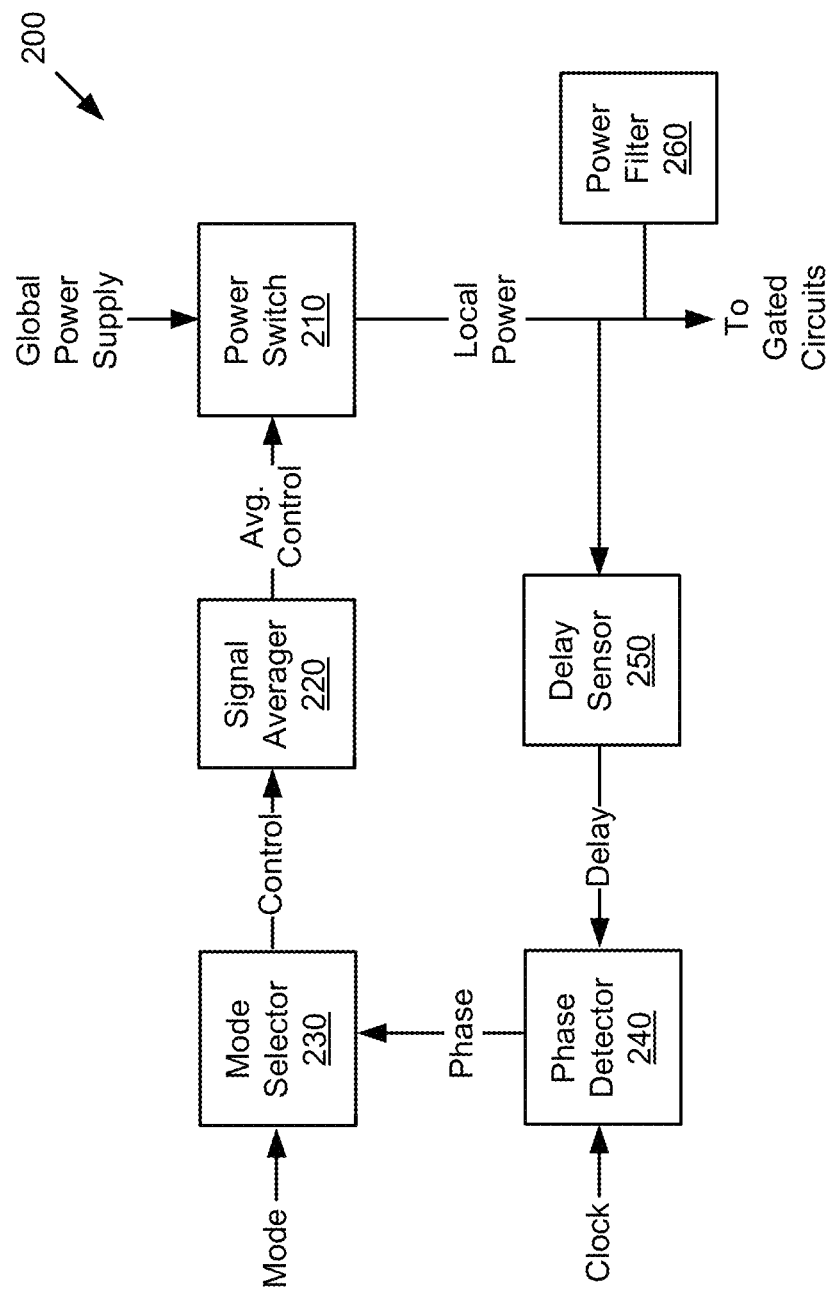
FIG. 2 is a block diagram of a system in accordance with one or more embodiments.

Referring to FIG. 2, shown is a block diagram of a control logic 200 in accordance with one or more embodiments. More specifically, the control logic 200 may be power control logic, and may generally correspond to all or a portion of the gating/regulating circuit 110 shown in FIG. 1. As shown, in some embodiments, the control logic 200 includes power switch 210, a signal averager 220, a mode selector 230, a phase detector 240, a delay sensor 250, and/or a power filter 260.

In one or more embodiments, the power switch 210 includes gating functionality to open and close a connection between a global power domain (e.g., an un-gated power supply) and a local power domain (e.g., gated circuits 120 shown in FIG. 1). Further, in some embodiments, the power switch 210 includes functionality to regulate a voltage level across the power switch 210 based on the control signal. For example, in some embodiments, the voltage across the power switch 210 may be selectively reduced, thereby enabling the local power voltage to be less than or equal to the global power voltage. Such gating/regulating functionality of the power switch 210 is described further below with reference to FIGS. 3A-5C.

In accordance with some embodiments, the delay sensor 250 includes functionality to simulate the time delay of the gated circuits when powered at the local power voltage. For example, in some embodiments, the delay sensor 250 provides a time delay equivalent to the maximum logic depth N of the gated circuits 120. Further, the delay sensor 250 also models additional delay effects in the gated circuits, such as delay flip-flops, thermal cutoffs, setup time, supply variations, etc. As shown, in some embodiments, the delay sensor 250 outputs a delay signal (i.e., a digital signal delayed by the time delay provided by the delay sensor 250) to the phase detector 240.

In one or more embodiments, the phase detector 240 includes functionality to compare the delay signal to a reference clock signal (labeled "Clock"). In one or more embodiments, the reference clock signal may be based on an operating gear (i.e., one of multiple data rate ranges). In accordance with some embodiments, the operating gear may be specified by one or more data interface protocols. For example, in some embodiments, the operating gear may conform to the M-PHY specification of the Mobile Industry Processor Interface (MIPI) Alliance (MIPI Specification for M-PHY Version 1.00.00 of Feb. 8, 2011, approved Apr. 28, 2011). In this example, the operating gear may be gear 1 (3 Mbps to 9 Mbps), gear 2 (6 Mbps to 18 Mbps), gear 3 (12 Mbps to 36 Mbps), gear 4 (24 Mbps to 72 Mbps), gear 5 (48 Mbps to 144 Mbps), gear 6 (96 Mbps to 288 Mbps), gear 7 (192 Mbps to 576 Mbps), etc. Further, in such embodiments, the gated circuits 120 may include data interface components conforming to the M-PHY specification of the MIPI Alliance.

As shown, in some embodiments, the phase detector 240 provides a phase signal (labeled "Phase") to the mode selector 230. In one or more embodiments, the phase signal may be a pulse-code modulation (PCM) signal which is high (e.g., "1") when the delay of the delay signal is longer than the period T of the clock signal, and which is low (e.g., "0") when the delay signal is shorter than the period T.

In accordance with some embodiments, the mode selector 230 includes functionality to enable an operating mode for the control logic 200 based on a mode input (labeled "Mode"). In some embodiments, such operating modes may include a power gating mode, a bypass mode, and an adaptive mode.

In one or more embodiments, the power gating mode corresponds to shutting off power to the gated circuits. Thus, in the power gating mode, the mode selector 230 may output a control signal (labeled "Control") indicating that the power switch 210 is to be fully open (i.e., no voltage is supplied to the gated circuits).

In accordance with some embodiments, the bypass mode corresponds to not gating the power to the gated circuits. Thus, in the bypass mode, the mode selector 230 may output a control signal indicating that the power switch 210 is to be fully closed (i.e., full voltage is supplied to the gated circuits).

In one or more embodiments, the adaptive mode corresponds to the variable adjustment of voltage to the gated circuits. Thus, in the adaptive mode, the mode selector 230 may output a control signal indicating that the power switch 210 is to provide a regulated voltage to the gated circuits based on the phase signal provided by the phase detector 240.

In some embodiments, the control signal from the mode selector 230 is provided to a signal averager 220. In one or more embodiments, the signal averager 220 performs a moving average of the control signal, and may provide the averaged control signal (labeled "Avg. Control") to the power switch 210. In such embodiments, the averaged control signal may smooth the transitions in voltage level provided by the power switch. In this manner, the local power voltage is regulated with minimal on/off switching, thereby reducing switching noise in the power supply.

In one or more embodiments, the power switch 210 regulates the local power voltage based on the averaged control signal. For example, in the power gating mode, the power switch 210 receives a continuous low control signal (e.g. "0"), and may thus remain fully open. Further, in the bypass mode, the power switch 210 may receive a continuous high control signal (e.g. "1"), and may thus remain fully closed. Furthermore, in the adaptive mode, the power switch 210 receives a variable control signal that is smoothed according to a moving average. In response, the power switch 210 may vary the local power voltage in inverse proportion to the control signal. For example, in some embodiments, the power switch 210 increases the local power voltage when the control signal moves lower, and decreases the local power voltage when the control signal moves higher.

Note that, in the adaptive mode, the signal averager 220, the mode selector 230, the phase detector 240, and the delay sensor 250 may function as a feedback loop for controlling the power switch 210. Specifically, in some embodiments, the local power voltage may be adjusted by this feedback mechanism to align the delay in the gated circuits to the reference time period. In this manner, the power consumption may be optimized for a particular application.

Figure 3A:
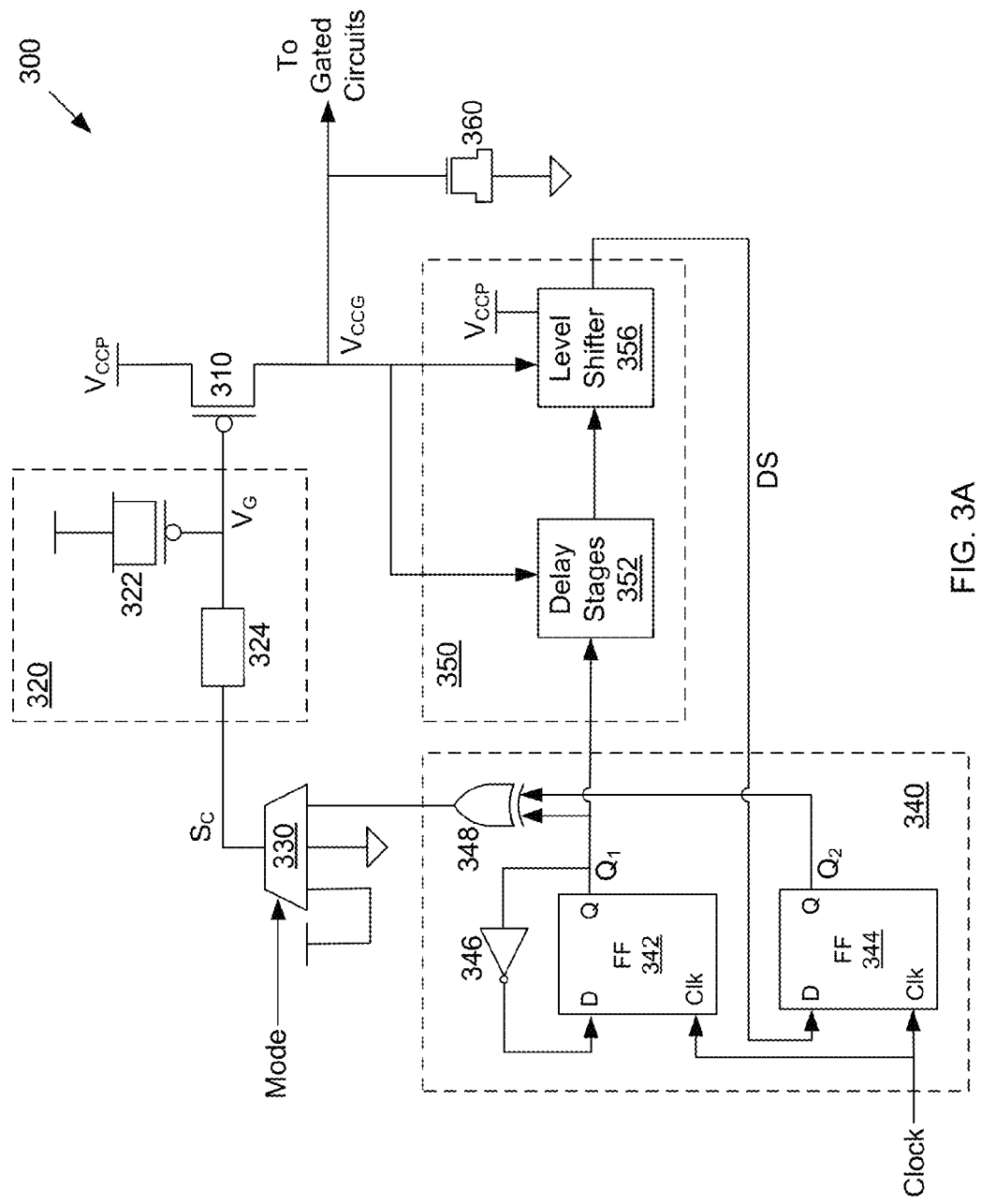
FIGS. 3A-3B are block diagrams of systems in accordance with one or more embodiments.

Referring to FIG. 3A, shown is a block diagram of a control circuit 300 in accordance with one or more embodiments. More specifically, the control circuit 300 may generally correspond to an example embodiment of the control logic 200 shown in FIG. 2.

As shown in FIG. 3A, the control circuit 300 includes a transistor 310 (corresponding generally to the power switch 210 shown in FIG. 2) coupled to a global power supply $V_{CPP}$. In some embodiments, the control gate of transistor 310 is coupled to a control voltage $V_G$. Further, in some embodiments, the transistor 310 may provide the local power voltage $V_{CCG}$ to the gated circuits (e.g., gated circuits 120 shown in FIG. 1) in response to the control voltage $V_G$. In one or more embodiments, the local power voltage $V_{CCG}$ provided by the transistor 310 may vary inversely with the level of the control voltage $V_G$. For example, in some embodiments, the transistor 310 may continuously vary the local power voltage $V_{CCG}$ in inverse proportion to the control voltage $V_G$, such that a high control voltage $V_G$ (e.g., "1") corresponds to the lowest local power voltage (e.g., $V_{CCG}$=0), and a low control voltage $V_G$ (e.g., "0") corresponds to the highest local power voltage (i.e., $V_{CCG}$=$V_{CCP}$) As shown, in some embodiments, the local power voltage $V_{CCG}$ provided to the gated circuits may be filtered by a local power filter 360.

In one or more embodiments, a delay sensor 350 (corresponding generally to the delay sensor 250 shown in FIG. 2) receives the local power voltage $V_{CCG}$ as an input. Further, in some embodiments, the delay sensor 350 may provide a delay signal (labeled "DS") to a phase detector 340 (corresponding generally to the phase detector 240 shown in FIG. 2).

As shown, in some embodiments, the delay sensor 350 includes delay stages 352 and a level shifter 356. In accordance with some embodiments, the delay stages 352 provide a time delay based on the local power voltage $V_{CCG}$. In some embodiments, the time delay provided by the delay stages 352 is substantially equivalent to the processing delay of the gated circuits receiving the local power voltage $V_{CCG}$. Further, in some embodiments, the level shifter 356 may include functionality to convert a signal level from the local power voltage $V_{CCG}$ to the global power voltage $V_{CCP}$, and thereby eliminate or reduce a direct current leakage path. Example embodiments of the delay stages 352 and the level shifter 356 are described below with reference to FIG. 3B.

As shown, in one or more embodiments, the phase detector 340 includes a first flip-flop (FF) 342, a second FF 344, an inverter 346, and an exclusive or (XOR) gate 348. In some embodiments, the clock inputs of the first FF 342 and the second FF 344 may both be coupled to a clock signal ("Clock"). Further, the delay signal DS may be provided to a data input of the second FF 344, and the output $Q_2$ of the second FF 344 may be provided to the XOR gate 348.

In one or more embodiments, the output $Q_1$ of the first FF 342 is provided to the inverter 346 and the XOR gate 348. As shown, the output of the inverter 346 is coupled to the data input of the first FF 342. Further, in some embodiments, the output $Q_1$ of the first FF 342 is provided as an input signal to the delay stages 352.

In one or more embodiments, the XOR gate 348 may perform an exclusive or of the output $Q_1$ of the first FF 342 and the output $Q_2$ of the second FF 344. Accordingly, the output of the XOR gate 348 is high (e.g., "1") if only one of $Q_1$ or $Q_2$ is high. In one or more embodiments, a high output from the XOR gate 348 indicates that the time delay indicated by the delay signal DS is longer than the period of the clock signal. Further, the output of the XOR gate 348 is low (e.g., "0") if $Q_1$ and $Q_2$ are both high, or if $Q_1$ and $Q_2$ are both low. In one or more embodiments, a low output from the XOR gate 348 may indicate that the time delay of the delay signal DS is shorter than the period of the clock signal.

In accordance with some embodiments, the output of the XOR gate 348 is provided to a third data input of a 3-to-1 multiplexer 330 (corresponding generally to the mode selector 230 shown in FIG. 2). As shown, in some embodiments, the first and second data inputs of multiplexer 330 is coupled to a constant voltage and a constant ground, respectively. Further, in some embodiments, the selector input of multiplexer 330 may be coupled to a mode selection signal.

In one or more embodiments, the mode selection signal includes a first bit corresponding to the gating mode, a second bit corresponding to the bypass mode, and a third bit corresponding to the adaptive mode. In some embodiments, the multiplexer 330 may be configured to select the first data input one (i.e., constant voltage) when the first bit is set in the mode selection signal to select the gating mode. Accordingly, in the gating mode, the output $S_c$ of the multiplexer 330 may be a continuous high signal. Further, the multiplexer 330 may be configured to select the second data input one (i.e., constant ground) when the second bit is set to select the bypass mode. Accordingly, in the bypass mode, the output $S_c$ of the multiplexer 330 may be a continuous low signal. Furthermore, the multiplexer 330 may be configured to select the third data input one (i.e., the output of the XOR gate 348) when the third bit is set to select the adaptive mode. Accordingly, in the adaptive mode, the output $S_c$ of the multiplexer 330 may be the output of the XOR gate 348.

In some embodiments, the output $S_c$ of the multiplexer 330 is provided to a low-pass filter 320 (corresponding generally to the signal averager 220 shown in FIG. 2). As shown, in one or more embodiments, the low-pass filter 320 may be a resistor-capacitor (RC) filter including resistor 324 and capacitor 322. In one or more embodiments, the low-pass filter 320 may provide the time averaged output signal as a control signal $V_G$ to the control gate of the transistor 310. In some embodiments, the gate voltage $V_G$ is smoothly pulled high when the local power voltage $V_{CCG}$ is above the target, and is smoothly pulled low when the local power voltage $V_{CCG}$ is below the target.

Figure 3B:
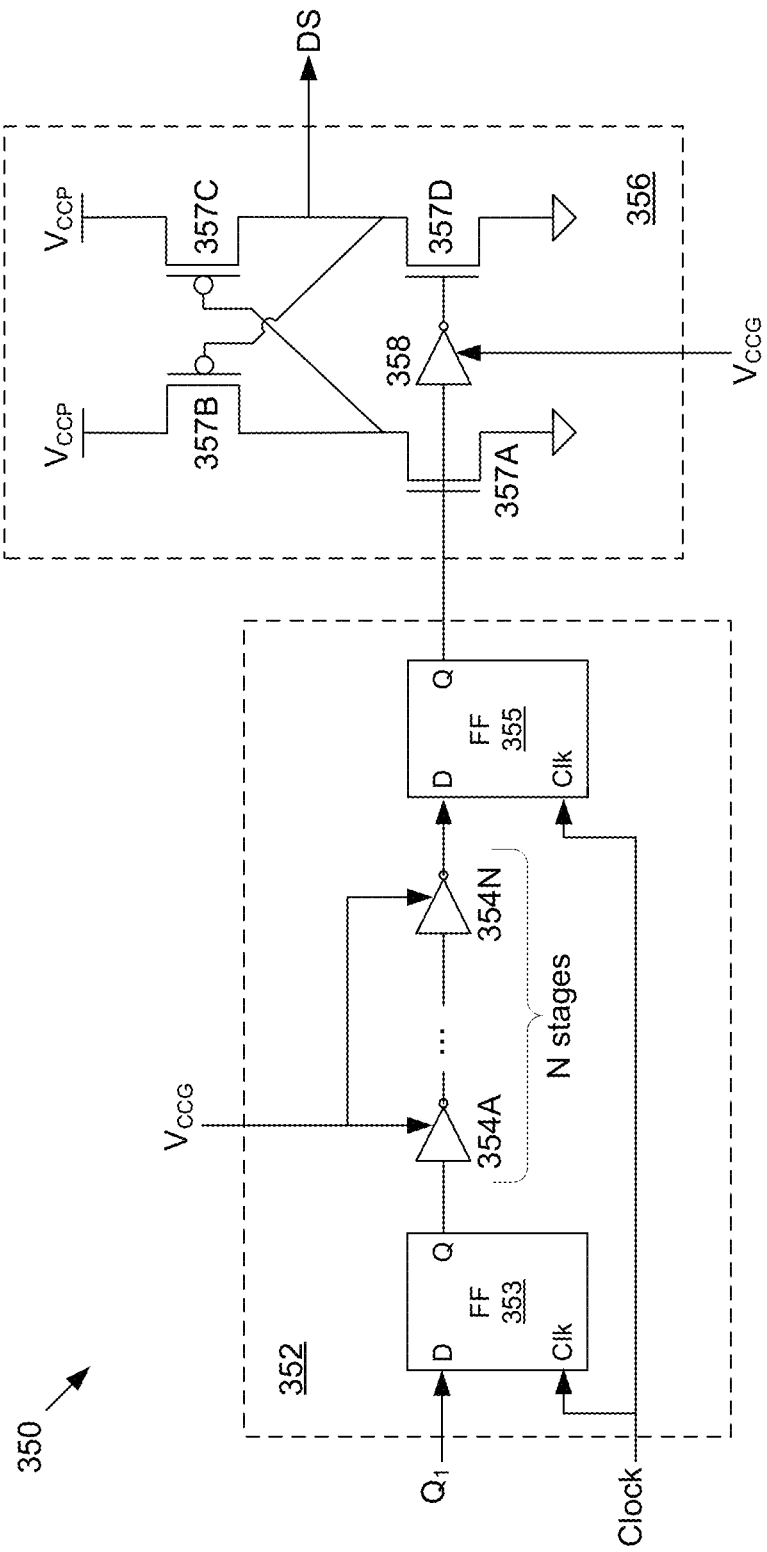

Referring to FIG. 3B, shown are example embodiments of the delay stages 352 and the level shifter 356 shown in FIG. 3A, in accordance with one or more embodiments. In some embodiments, the delay stages 352 includes a third FF 353, a fourth FF 355, and N inverters 354A-354N. Further, in some embodiments, the level shifter 356 includes four transistors 357A-357D and an inverter 358.

As shown, the third FF 353 may have a data input coupled to the signal $Q_1$ (i.e., the output of the first FF 342 shown in FIG. 3A), and a clock input coupled to the reference clock signal. Further, the output of the third FF 353 may be provided to the N inverters 354A-354N. Furthermore, in one or more embodiments, the output of the N inverters 354A-354N may be coupled to the data input of the fourth FF 355, and the reference clock signal may be coupled to the clock input of the fourth FF 355.

As shown, in some embodiments, each of the N inverters 354A-354N may be a tri-state inverter with a control input coupled to the local power voltage $V_{CCG}$. In one or more embodiments, the number N of inverters 354A-354N may correspond to the maximum logic depth N of the gated circuits (e.g., gated circuits 120 shown in FIG. 1). As such, the N inverters 354A-354N may provide a delay equivalent to the logic delay of the gated circuits when powered at the local power voltage $V_{CCG}$.

In one or more embodiments, the output of the fourth FF 355 is provided to the level shifter 356, specifically to the control gate of the first transistor 357A and the inverter 358. In some embodiments, the first terminal of the first transistor 357A is coupled to constant ground. Further, the second terminal of the first transistor 357A is coupled to the first terminal of the second transistor 357B, and to the control gate of the third transistor 357C.

As shown, in some embodiments, the second terminal of the second transistor 357B and the second terminal of the third transistor 357C may both be coupled to the global power voltage $V_{CCP}$. Further, the first terminal of the third transistor 357C may correspond to the delay signal DS, and may be coupled to both a control gate of the second transistor 357B and a second terminal of the fourth transistor 357D.

In one or more embodiments, the inverter 358 is a tri-state inverter with a control input coupled to the local power voltage $V_{CCG}$. Further, in some embodiments, the output of the inverter 358 may be coupled to the control gate of the fourth transistor 357D. In addition, the first terminal of the fourth transistor 357D may be coupled to constant ground.

Note that the examples shown in FIGS. 1, 2, and 3A-3B are provided for the sake of illustration, and are not intended to limit any embodiments. For example, while embodiments may be shown in simplified form for the sake of clarity, embodiments may include any number and/or arrangement of additional components (e.g., processors, memory devices, connectors, power supplies, filters, input buffers, output buffers, etc.). In another example, it is contemplated that some embodiments may include different arrangements of the components than those shown in FIGS. 1, 2, and 3A-3B. Further, it is contemplated that specifics in the examples shown in FIGS. 1, 2, and 3A-3B may be used anywhere in one or more embodiments.

Figure 4A:
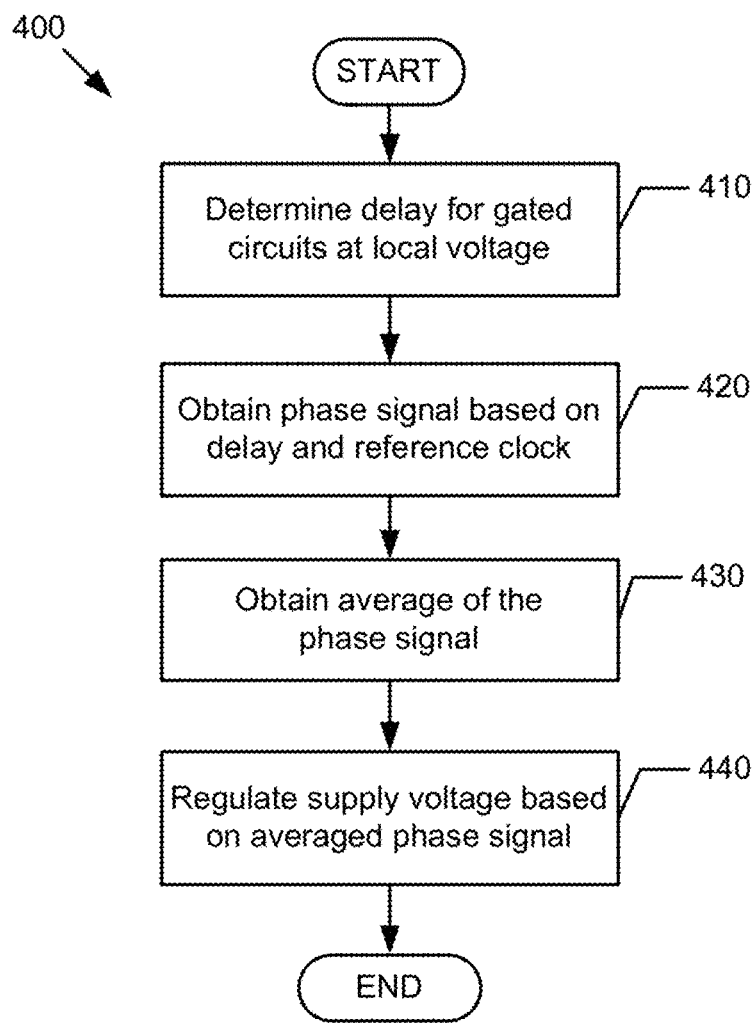
FIGS. 4A-4B are sequences in accordance with one or more embodiments.

Referring now to FIG. 4A, shown is a sequence 400 for power control in an adaptive mode, in accordance with one or more embodiments. In one or more embodiments, the sequence 400 may be part of the gating/regulating logic 110 shown in FIG. 1. The sequence 400 may be implemented in hardware, software, and/or firmware. In firmware and software embodiments it may be implemented by computer executed instructions stored in a non-transitory computer readable medium, such as an optical, semiconductor, or magnetic storage device.

At step 410, a delay for gated circuits operating at a local voltage is determined For example, referring to FIG. 2, the delay sensor 250 may model the delay of gated circuits when powered at the local power voltage (e.g., delays due to logic depth, flip-flops, thermal cutoffs, setup time, supply variations, etc.). In some embodiments, the delay sensor 250 may include a number of tri-state inverters powered at the local power voltage.

At step 420, a phase signal is obtained based on a reference clock signal and the delay (determined at step 410). For example, referring to FIG. 2, the phase detector 240 provides a high phase signal when the delay is longer than a period T of the reference clock signal, and provides a low phase signal when the delay signal is shorter than the period T.

At step 430, an average of the phase signal is obtained. For example, referring to FIG. 2, the signal averager 220 may perform a moving average of the phase signal. In this manner, the phase signal is smoothed over time, thereby reducing switching noise in the power supply. In one or more embodiments, the signal averager 220 may be implemented using the low-pass filter 320 shown in FIG. 3A.

At step 440, a voltage supply is regulated based on the averaged phase signal (obtained at step 430). For example, referring to FIG. 2, the power switch 210 provides the local power voltage based on a control signal (i.e., the averaged phase signal) received from the signal averager 220. The regulated local power may then be provided to the gated circuits (e.g., gated circuits 120 shown in FIG. 1). In some embodiments, the power switch 210 may increase the local power voltage when the control signal moves lower, and may decrease the local power voltage when the control signal moves higher. In one or more embodiments, the power switch 210 may be implemented using the transistor 310 shown in FIG. 3A. After step 440, the sequence 400 ends.

Figure 4B:
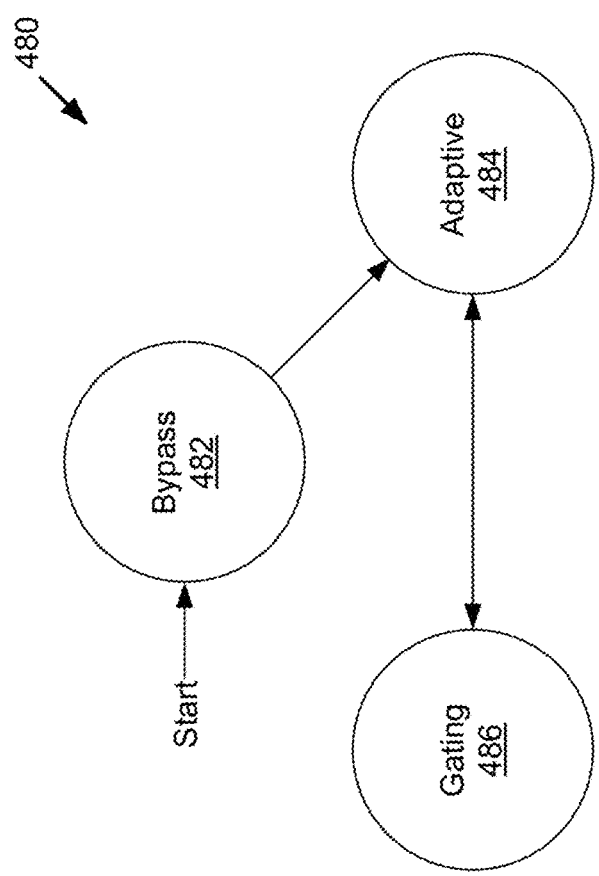

Referring now to FIG. 4B, shown is a sequence 480 in accordance with one or more embodiments. The sequence 480 may be implemented in hardware, software, and/or firmware. In firmware and software embodiments it may be implemented by computer executed instructions stored in a non-transitory computer readable medium, such as an optical, semiconductor, or magnetic storage device.

In one or more embodiments, the sequence 480 may be implemented by the gating/regulating logic 110 shown in FIG. 1. At start-up, the gating/regulating logic 110 may start in a bypass mode 482. In the bypass mode 482, the local power voltage (e.g., $V_{CCG}$) may be set equal to the global power voltage (e.g., $V_{CCP}$). Further, during bypass mode 482, the control circuits and gated circuits (e.g., gating/regulating logic 110 and gated circuits 120 shown in FIG. 1) may be allowed to ramp up to full power.

After the control circuits and gated circuits are ramped to full power, the gating/regulating logic 110 may be transitioned to the adaptive mode 484. In the adaptive mode 484, the local power voltage (e.g., $V_{CCG}$) may be continually adjusted based on a control signal (e.g., $V_G$) provided by the gating/regulating logic 110.

Once in the adaptive mode 484, the gating/regulating logic 110 may be transitioned to the gating mode 486. In the gating mode 486, the local power voltage (e.g., $V_{CCG}$) may be switched off, thereby shutting off all power to the gated circuits. Further, the gating/regulating logic 110 may be transitioned directly between the gating mode 486 and the adaptive mode 484, without passing through the bypass mode 482. In this manner, switching stress on the gating/regulating logic 110 may be reduced.

Figure 5A:
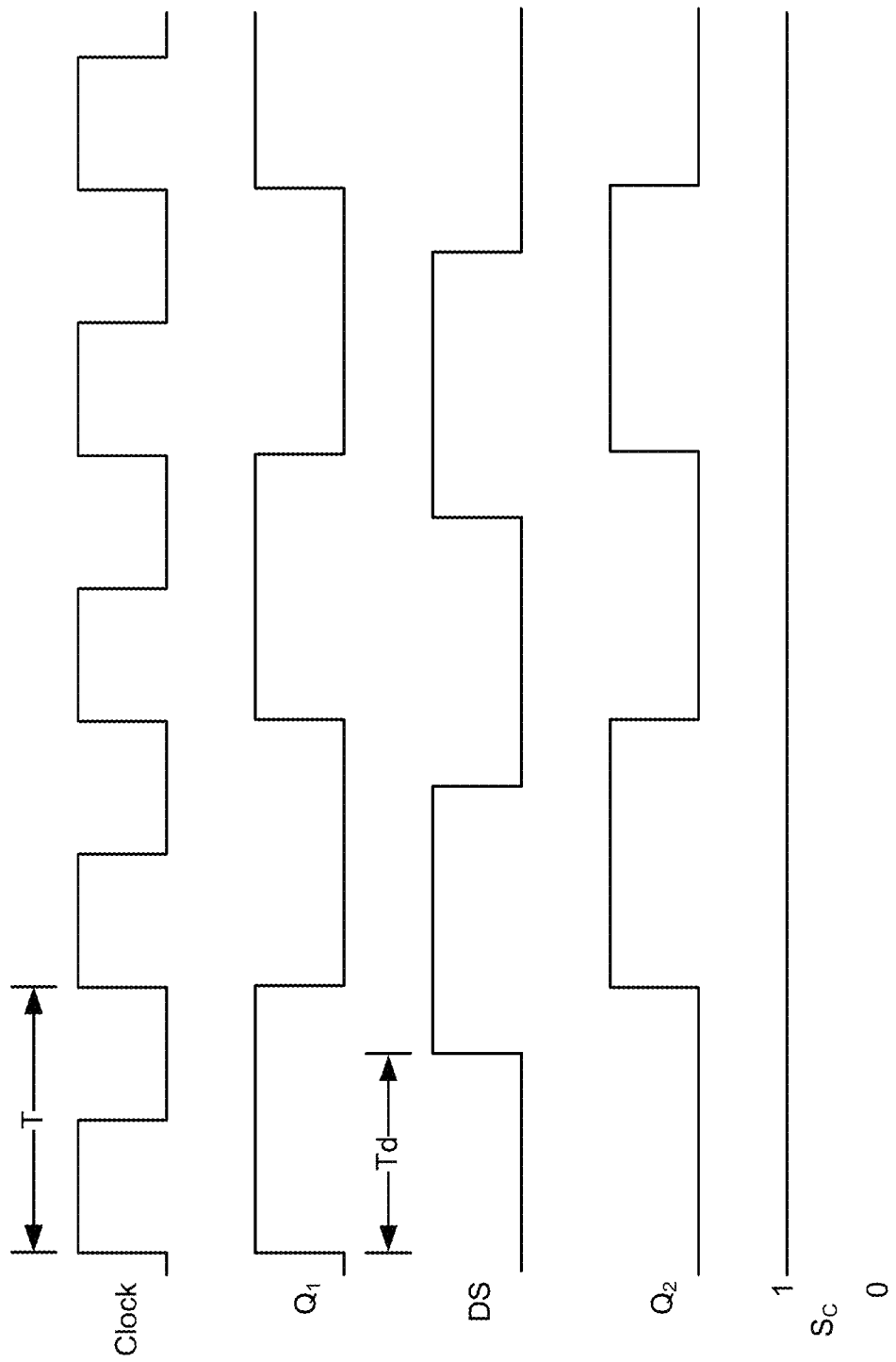
FIGS. 5A-5C are example timing diagrams in accordance with one or more embodiments.

Referring now to FIG. 5A, shown is a first example timing diagram of a system in accordance with one or more embodiments. Specifically, FIG. 5A illustrates examples of five signals involved in the systems and processes discussed above with reference to FIGS. 1-4B.

The first signal is a reference clock signal ("Clock") having a period T. The second signal $Q_1$ may represent the input signal to the delay sensor 350 (i.e., the output signal of the first FF 342). The third signal DS may represent the output signal of the delay sensor 350. The fourth signal $Q_2$ may represent the output signal of the second FF 344. The fifth signal $S_c$ may be the output signal provided by the multiplexer 330.

As shown, the time difference Td between the input signal $Q_1$ and output signal DS is the time delay associated with the delay sensor 350, and thus may represent the signal delay for the gated circuits (e.g., gated circuits 120 shown in FIG. 1). Note that, in this example, the delay Td is less than the period T of the reference clock. Accordingly, the output signal $S_c$ is a high value (e.g., "1"), thus indicating that the local power voltage $V_{CCG}$ is too high. In one or more embodiments, the power switch 210 may respond to the high $S_c$ signal by reducing the local power voltage $V_{CCG}$ (not shown). Further, in some embodiments, the reduced local power voltage $V_{CCG}$ may cause the delay Td to be increased, and may thus move Td closer to alignment with T.

Figure 5B:
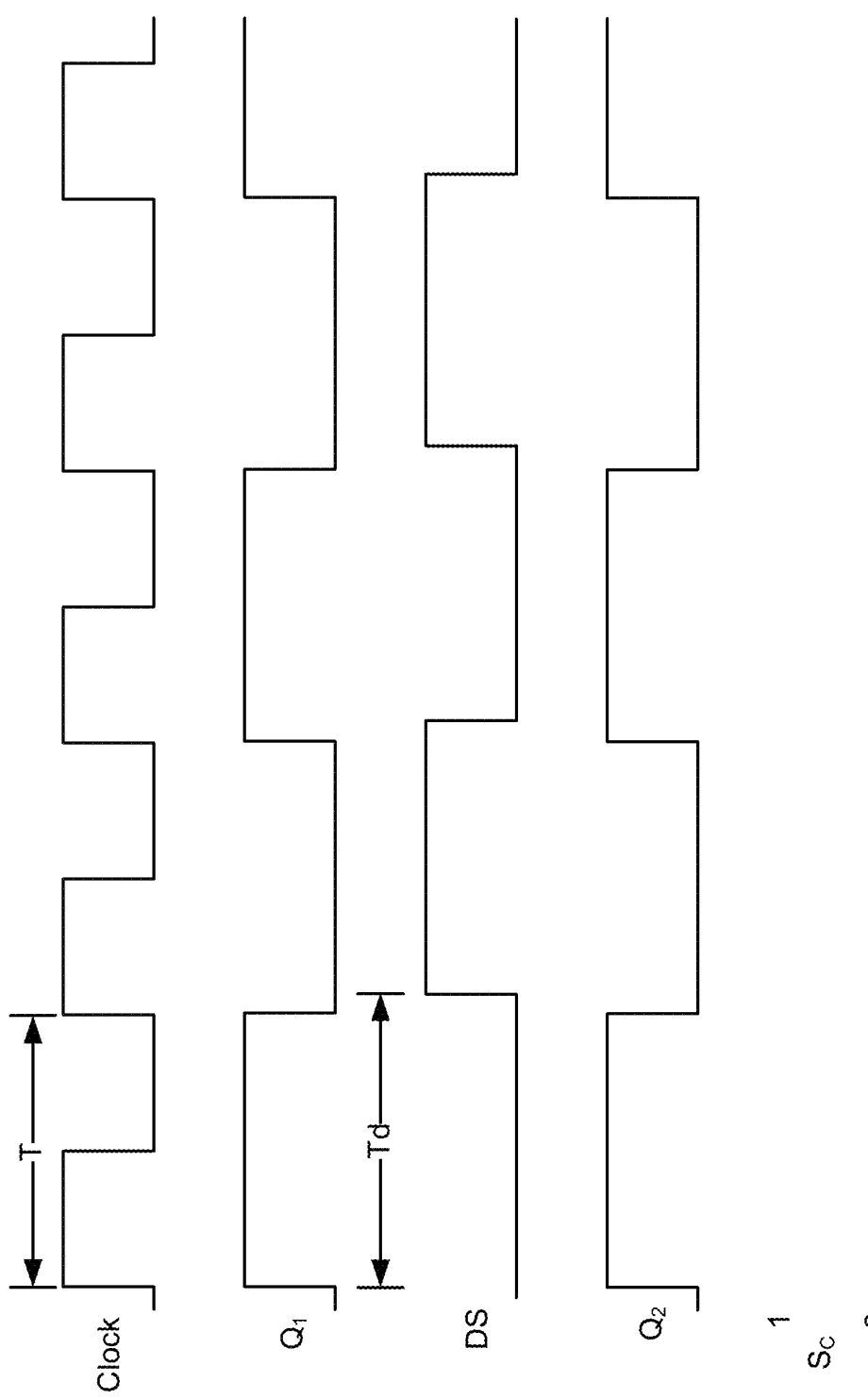

Referring now to FIG. 5B, shown is a second example timing diagram of a system in accordance with one or more embodiments. Specifically, FIG. 5B illustrates examples of signals involved in the systems and processes discussed above with reference to FIGS. 1-4B.

Note that, in this example, the delay Td is greater than the period T of the reference clock. Accordingly, the output signal $S_c$ is a low value (e.g., "0"), thus indicating that the local power voltage $V_{CCG}$ is too low. In one or more embodiments, the power switch 210 may respond to the low $S_c$ signal by increasing the local power voltage $V_{CCG}$ (not shown). Further, in some embodiments, the increased local power voltage $V_{CCG}$ may cause the delay Td to be decreased, and may thus move Td closer to alignment with T.

Figure 5C:
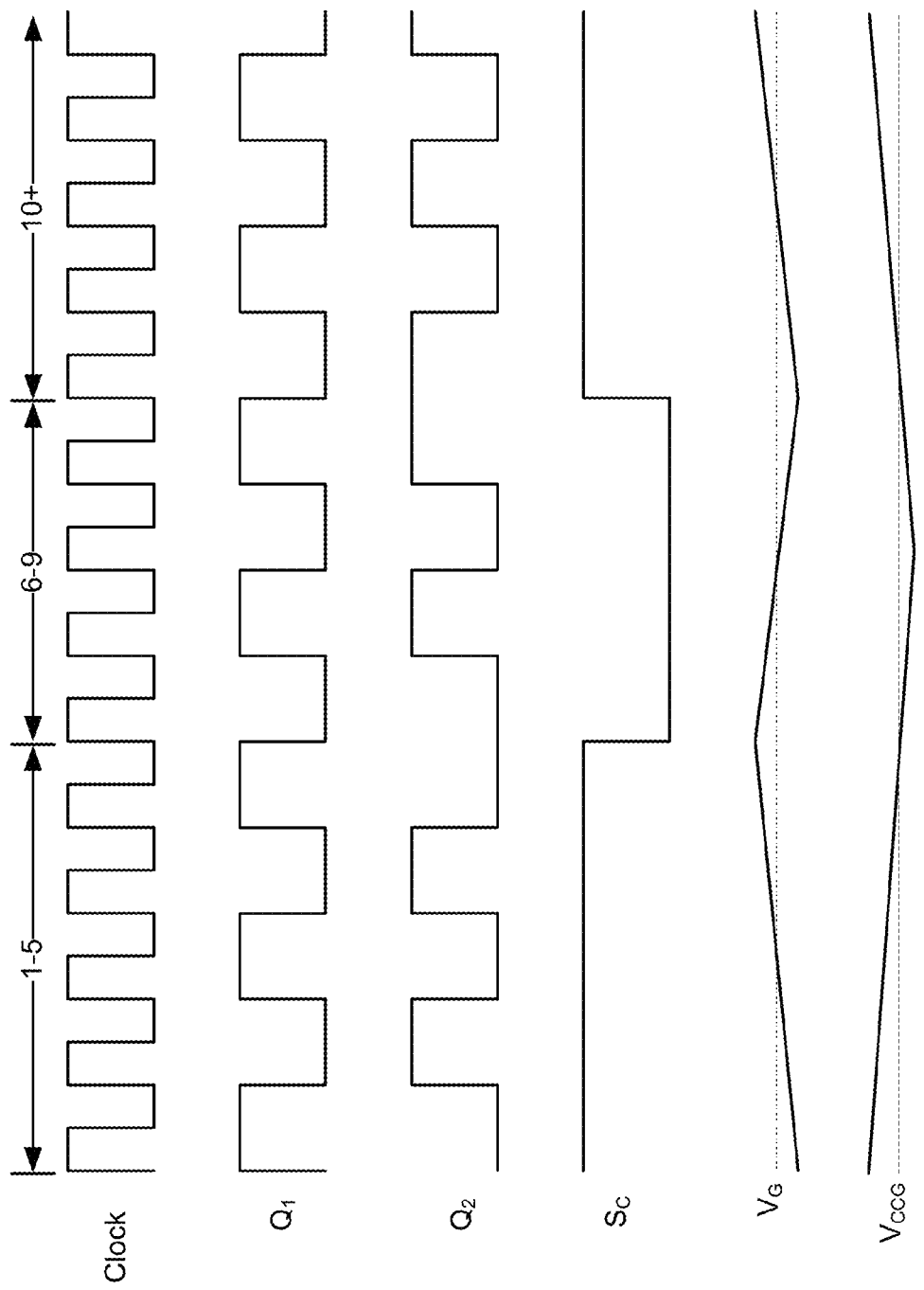

Referring now to FIG. 5C, shown is a third example timing diagram of a system in accordance with one or more embodiments. Specifically, FIG. 5C illustrates examples of signals involved in the systems and processes discussed above with reference to FIGS. 1-4B.

In FIG. 5C, the first signal is the clock signal, the second signal is $Q_1$, the third signal is $Q_2$, and the fourth signal is $S_c$. In addition, the fifth signal is the gate voltage $V_G$ (i.e., the control signal received at the control gate of the power switch 210, as shown in FIG. 2). Further, the sixth signal is the local power voltage $V_{CCG}$. In this diagram, the desired levels of the gate voltage $V_G$ and the local power voltage $V_{CCG}$ are indicated by dotted lines.

Assume that, during clock cycles 1-5, the delay Td (not shown) is less than the period T of the reference clock signal. Accordingly, as shown, the signals $Q_1$ and $Q_2$ have opposite values, and thus signal $S_c$ has a high value (e.g., "1"), indicating that the local power voltage $V_{CCG}$ is too high. Further, because the gate voltage $V_G$ is a moving average of signal $S_c$, the gate voltage $V_G$ increases gradually during clock cycles 1-5. Furthermore, because the local power voltage $V_{CCG}$ varies inversely to the gate voltage $V_G$, the local power voltage $V_{CCG}$ decreases gradually during clock cycles 1-5. Note that the local power voltage $V_{CCG}$ passes below the desired level after clock cycle 5.

As shown, during clock cycles 6-9, the signals $Q_1$ and $Q_2$ the same values, and thus signal $S_c$ has a low value (e.g., "0"). These signals may indicate that the delay Td is now greater than the clock period T, and thus the local power voltage $V_{CCG}$ is too low. Note that the gate voltage $V_G$, as a moving average of signal $S_c$, decreases gradually during clock cycles 6-9. Further, the local power voltage $V_{CCG}$ begins to increase gradually during clock cycles 6-9. Note also that the local power voltage $V_{CCG}$ passes above the desired level after clock cycle 9.

Beginning at clock cycle 10, the signals $Q_1$ and $Q_2$ again have opposite values, and thus signal $S_c$ returns to a high value (e.g., "1"). These signals may indicate that the delay Td is again less than the clock period T, and thus the local power voltage $V_{CCG}$ is too high. Accordingly, the gate voltage $V_G$ increases gradually after clock cycle 10. Further, the local power voltage $V_{CCG}$ begins to decrease gradually after clock cycles 10.

Note that the iterative process illustrated in FIG. 5C may enable a power control circuit (e.g., control circuit 300) to adaptively adjust the local power voltage $V_{CCG}$ using a negative feedback loop. Further, by time averaging the control signal $S_c$ (e.g., in PWM form), the local power voltage $V_{CCG}$ may be optimized with minimal circuit loading and signal noise.

Figure 6:
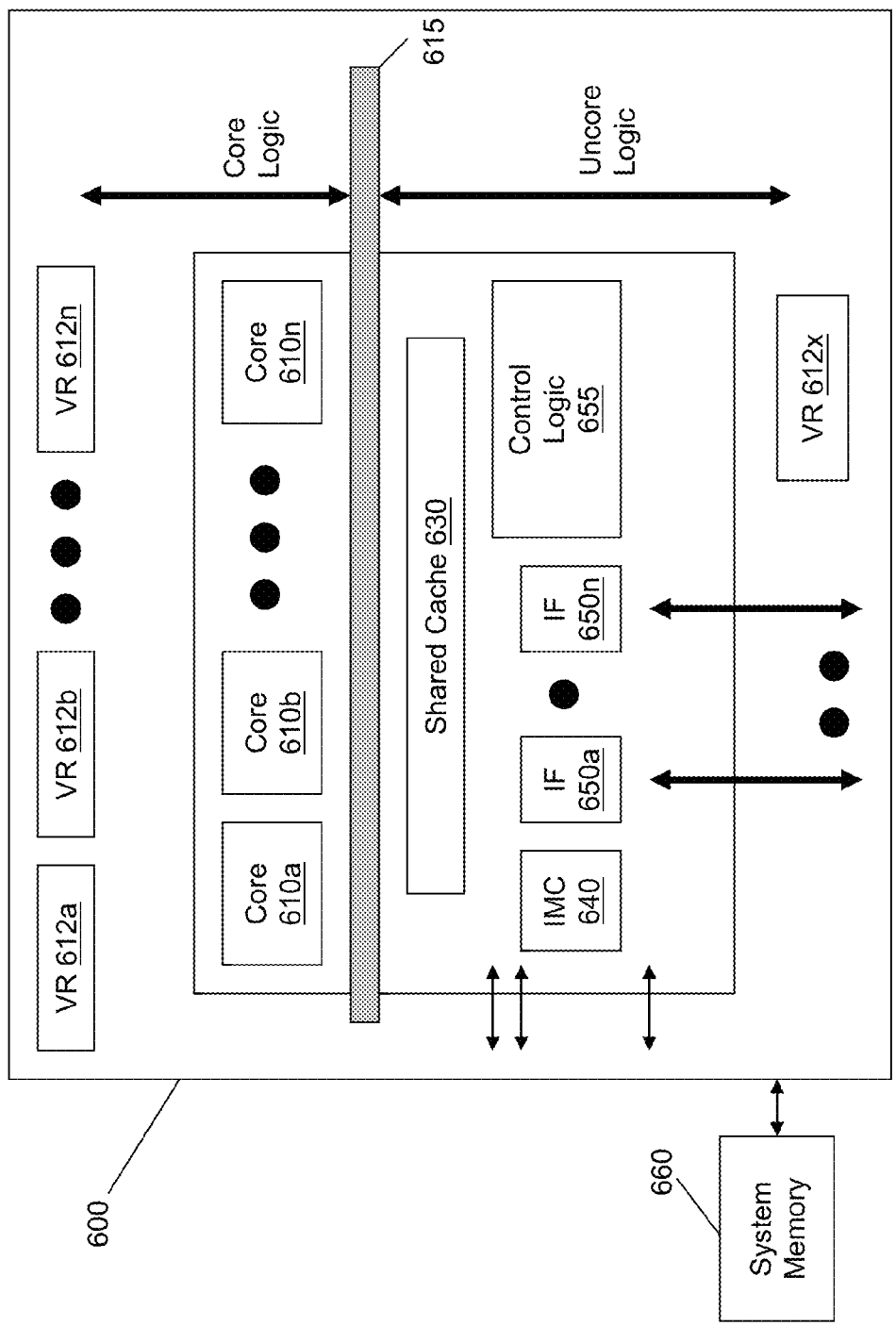
FIG. 6 is a block diagram of a processor in accordance with one or more embodiments.

Referring now to FIG. 6, shown is a block diagram of a processor in accordance with one or more embodiments. As shown in FIG. 6, processor 600 may be a multicore processor including a plurality of cores 610a-610n. Each core may be associated with a corresponding voltage regulator 612a-612n. The various cores may be coupled via an interconnect 615 to an uncore logic that includes various components. As seen, the uncore logic may include a shared cache 630 which may be a last level cache. In addition, the uncore logic may include an integrated memory controller 640, various interfaces 650 and control logic 655.

In one or more embodiments, the control logic 655 may include all or a portion of the control logic 200 and/or the control circuit 300 described above with reference to FIGS. 2-3B. Thus, the control logic 655 may be power control logic, and may enable power gating/regulating to the cores 610a-610n and/or other components (e.g., components included in a mobile computing device) in accordance with some embodiments.

With further reference to FIG. 6, processor 600 may communicate with a system memory 660, e.g., via a memory bus. In addition, by interfaces 650, connection can be made to various off-chip components such as peripheral devices, mass storage and so forth. While shown with this particular implementation in the embodiment of FIG. 6, the scope of the various embodiments discussed herein is not limited in this regard.

Figure 7:
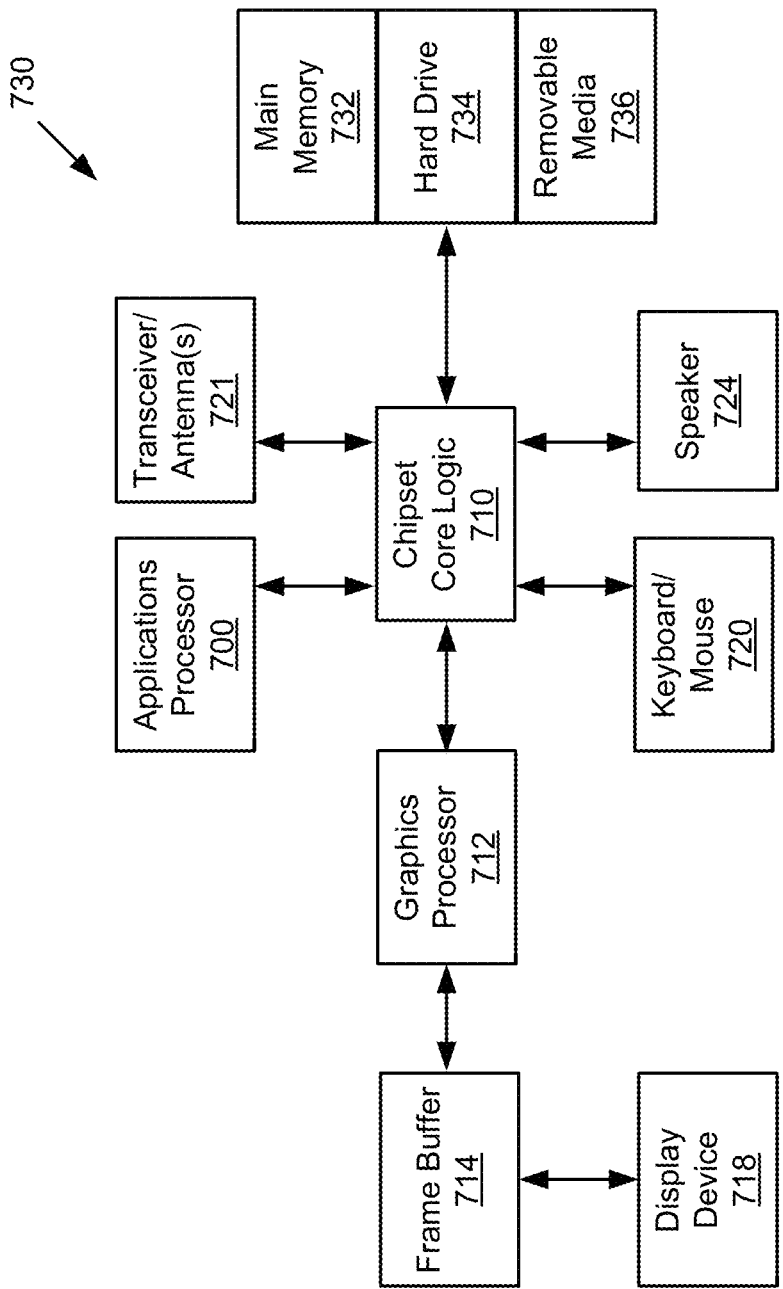
FIG. 7 is a block diagram of an example system in accordance with one or more embodiments.

Embodiments may be used in many different environments. Referring now to FIG. 7, shown is a block diagram of a computer system 730 with which embodiments can be used. The computer system 730 may include a hard drive 734 and a removable storage medium 736, coupled by a bus (shown as an arrow) to a chipset core logic 710. A keyboard and/or mouse 720, or other conventional components, may be coupled to the chipset core logic.

The core logic may couple to the graphics processor 712, and the applications processor 700 in one embodiment. The graphics processor 712 may also be coupled to a frame buffer 714. The frame buffer 714 may be coupled to a display device 718, such as a liquid crystal display (LCD) touch screen. In one embodiment, the graphics processor 712 may be a multi-threaded, multi-core parallel processor using single instruction multiple data (SIMD) architecture.

The chipset logic 710 may include a non-volatile memory port to couple to the main memory 732. Also coupled to the core logic 710 may be a radio transceiver and antenna(s) 721. Speakers 724 may also be coupled to core logic 710. In one or more embodiments, core logic 710 may include all or a portion of the control logic 200 and/or the control circuit 300 described above with reference to FIGS. 2-3B.

Figure 8:
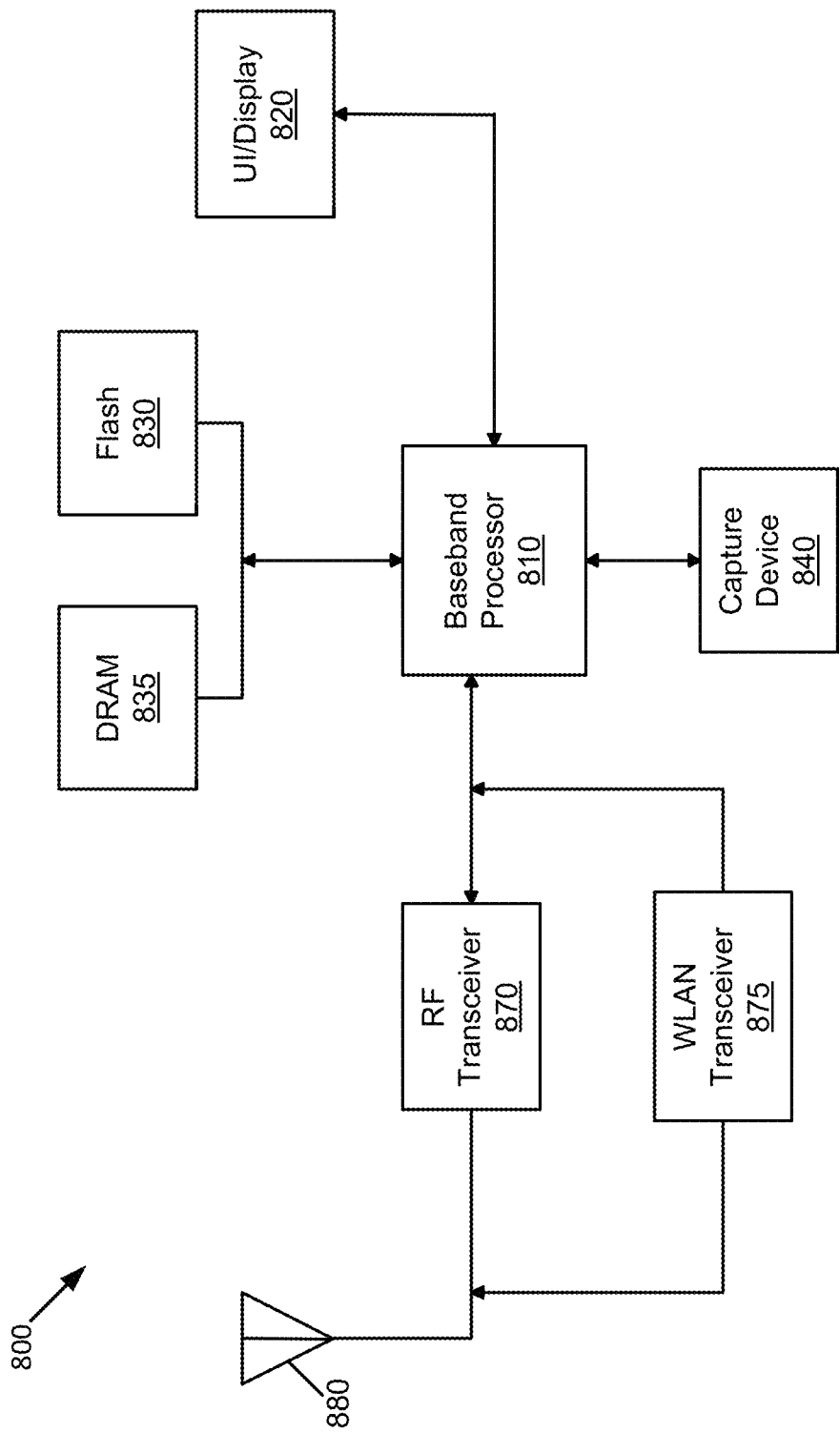
FIG. 8 is a block diagram of an example system in accordance with one or more embodiments.

Referring now to FIG. 8, shown is a block diagram of an example system 800 with which embodiments can be used. As seen, system 800 may be a smartphone or other wireless communicator. As shown in the block diagram of FIG. 8, system 800 may include a baseband processor 810 which may be a multicore processor that can handle both baseband processing tasks as well as application processing. Thus baseband processor 810 can perform various signal processing with regard to communications, as well as perform computing operations for the device. In turn, baseband processor 810 can couple to a user interface/display 820 which can be realized, in some embodiments by a touch screen display.

In addition, baseband processor 810 may couple to a memory system including, in the embodiment of FIG. 8 a non-volatile memory, namely a flash memory 830 and a system memory, namely a dynamic random access memory (DRAM) 835. As further seen, baseband processor 810 can further couple to a capture device 840 such as an image capture device that can record video and/or still images. In one or more embodiments, baseband processor 810 may include all or a portion of the control logic 200 and/or the control circuit 300 described above with reference to FIGS. 2-3B.

To enable communications to be transmitted and received, various circuitry may be coupled between baseband processor 810 and an antenna 880. Specifically, a radio frequency (RF) transceiver 870 and a wireless local area network (WLAN) transceiver 875 may be present.

In general, RF transceiver 870 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. Other wireless communications such as receipt or transmission of radio signals, e.g., AM/FM, or global positioning satellite (GPS) signals may also be provided. In addition, via WLAN transceiver 875, local wireless signals, such as according to a Bluetooth™ standard or an IEEE 802.11 standard such as IEEE 802.11a/b/g/n can also be realized. Although shown at this high level in the embodiment of FIG. 8, understand the scope of the present invention is not limited in this regard.

Figure 9A:
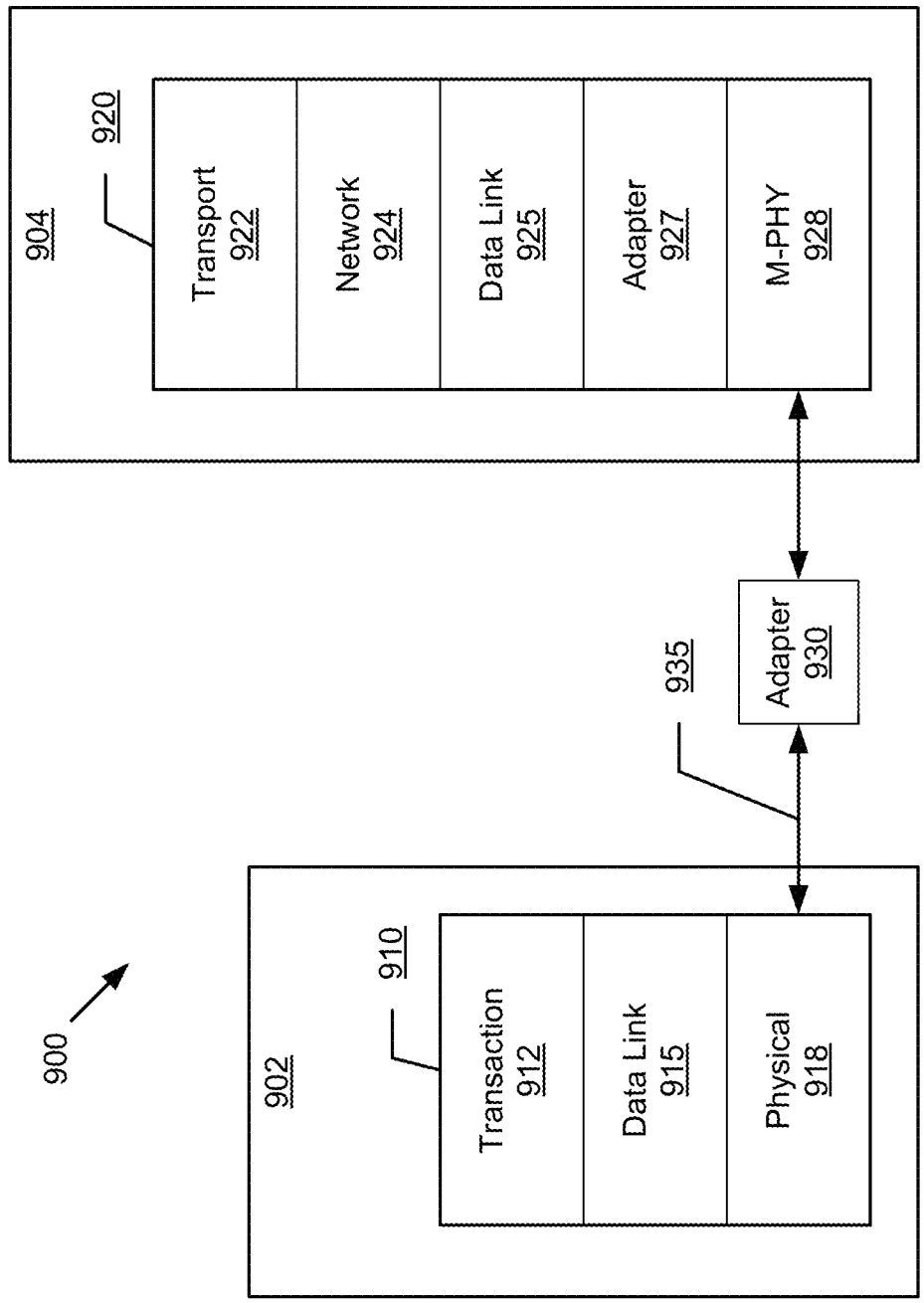
FIGS. 9A-9B are block diagrams of example systems in accordance with one or more embodiments.

Referring now to FIG. 9A, shown is an example system 900 with which embodiments can be used. As shown, the system 900 includes a first device 902 and a second device 904. The first device 902 may implement a Peripheral Component Interconnect Express (PCIe) protocol stack 910, conforming to the PCIe specification of the PCI Special Interest Group (PCIe 3.0 Specification of Nov. 18, 2010). Further, the second device 904 may implement a Unified Protocol ("UniPro") protocol stack 920, conforming to the UniPro specification of the MIPI Alliance (UniPro 1.41.00 Specification of Jul. 30, 2012).

As shown, the PCIe protocol stack 910 includes a transaction layer 912, a data link layer 915, and a physical layer 918. Further, the UniPro protocol stack 920 includes a transport layer 922, a network layer 924, a data link layer 925, an adapter layer 927, and a physical ("M-PHY") layer 928. In some embodiments, the adapter layer 927 may abstract differences between alternative technologies implemented in the M-PHY layer 928.

In one or more embodiments, the first device 902 and the second device 904 may communicate using, respectively, the PCIe protocol stack 910 and the UniPro protocol stack 920. As shown, in some embodiments, such communication may occur across a physical link 935. In some embodiments, the physical layer 918 may manage the connection of the first device 902 to the physical link 935. Further, the M-PHY layer 928 may manage the connection of the second device 904 to the physical link 935. For example, in one or more embodiments, the physical layer 918 and the M-PHY layer 928 may control communication parameters such as electrical levels, timing, and logical issues. Furthermore, in some embodiments, an adapter 930 may adapt the communication parameters used by the physical layer 918 to/from the communication parameters used by the M-PHY layer 928. Accordingly, in this manner, the first device 902 may communicate with the second device 904.

Figure 9B:
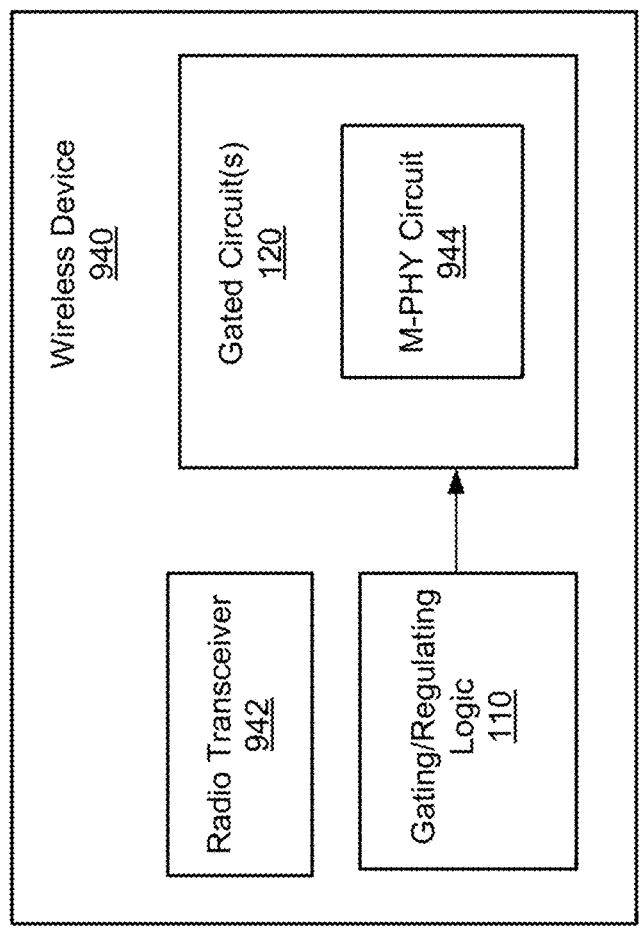

Referring now to FIG. 9B, shown is an wireless device 940 with which embodiments can be used. The wireless device 940 may be any electronic device including wireless communication functionality, such as a cellular telephone, a personal digital assistant (PDA), a media player, a laptop, a tablet, etc.

As shown, the wireless device 940 may include a radio transceiver 942. The radio transceiver 942 may provide a radio interface to another wireless device and/or a larger network (not shown) such as a core network, a local area network, the Internet, etc. For example, the radio transceiver 942 may enable a wireless connection to a base station, a wireless access point, a cellular tower, etc.

As shown, in one or more embodiments, the wireless device 940 may also include the gating/regulating logic 110 and gated circuits 120 (described above with reference to FIG. 1). Further, the gated circuits 120 may include a M-PHY circuit 944. In some embodiments, the M-PHY circuit 944 may include functionality to establish a data connection conforming to the M-PHY specification of the MIPI Alliance. Thus, in some embodiments, the gating/regulating logic 110 may enable power gating/regulating to the M-PHY circuit 944, as described above. In this manner, the electrical power consumed for M-PHY data connections provided by the M-PHY circuit 944 may be reduced.

Embodiments may be used in many different types of systems. For example, in one embodiment a communication device can be arranged to perform the various methods and techniques described herein. Of course, the scope of the present invention is not limited to a communication device, and instead other embodiments can be directed to other types of apparatus for processing instructions, or one or more machine readable media including instructions that in response to being executed on a computing device, cause the device to carry out one or more of the methods and techniques described herein.

Embodiments may be implemented in code and may be stored on a non-transitory storage medium having stored thereon instructions which can be used to program a system to perform the instructions. The storage medium may include, but is not limited to, any type of disk including floppy disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

The following clauses and/or examples pertain to further embodiments. One example embodiment may be an apparatus including: a power switch to provide a local power voltage at least one gated circuit based on a control signal; a delay sensor to provide a delay substantially equivalent to a processing delay of the at least one gated circuit; and a phase detector to provide the control signal based at least in part on the delay. The apparatus may also include a signal averager to smooth the control signal before being provided to the power switch. The signal averager may include a resistor-capacitor low-pass filter. The signal averager may be to perform a moving average of the control signal. The apparatus may also include a power filter to filter the local power voltage. The apparatus may also include a mode selector to select one of a plurality of operating modes. The plurality of operating modes may include a bypass mode, a gating mode, and an adaptive mode. The delay sensor may include N inverters to model a logic depth of the at least one gated circuit. Each of the N inverters may be a tri-state inverter with a control input coupled to the local power voltage. The delay sensor may include a level shifter to convert a signal level from the local power voltage to a global power voltage. The phase detector may be to provide the control signal based on comparison of the delay to a reference clock period.

Another example embodiment may be a system including: a system on a chip comprising at least one core having at least one execution unit and power control logic, the power control logic including a power switch to provide a local power voltage based on a control signal; a delay sensor to provide a delay for at least one gated circuit based on the local power voltage; and a phase detector to provide the control signal based on the delay. The system may also include a gated circuit powered by the local power voltage. The system may also include a multiplexer to select an operating mode of the power control logic. The system may also include a low-pass filter to smooth the control signal. The phase detector may also include at least two flip-flops. The phase detector may include an exclusive or (XOR) gate, where the inputs of the XOR gate is coupled to each output of the at least two flip-flops. The power switch may be to vary the local power voltage in inverse proportion to the control signal. The power switch may include a transistor, where a control gate of the transistor is coupled to the control signal.

Yet another example embodiment may be a method including: determining, using a delay circuit, a delay to model an operating delay of a gated circuit operating at a local power voltage; obtaining a phase signal based on the delay and a reference clock signal; averaging the phase signal to obtain an averaged phase signal; and regulating the local power voltage via a power switch coupled to the averaged phase signal. Obtaining the phase signal may include providing a first phase signal when the delay is longer than a period of the reference clock signal, the first phase signal indicating a need to increase the local power voltage. Obtaining the phase signal may include providing a second phase signal when the delay signal is shorter than a period of the reference clock signal, the second phase signal indicating a need to decrease the local power voltage. The reference clock signal may be based on at least one operating gear of a data interface protocol. The method may also include gating the local power voltage via the power switch in a gating mode, and providing the local power voltage via the power switch in a bypass mode. The method may also include variably adjusting, via the power switch in an adaptive mode, the local power voltage responsive to the averaged phase signal to regulate the local power voltage.

Still another example embodiment may be an apparatus including: a gated interface circuit to process signals conforming to the Mobile Industry Processor Interface (MIPI) M-PHY Specification; a delay sensor to provide a delay based on a processing delay of the gated interface circuit; a phase detector to provide the control signal based at least in part on the delay; and a power switch to provide a local power voltage to the gated interface circuit based on the control signal. The apparatus may also include a radio transceiver. The apparatus may be at least a portion of a wireless communication device.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments for the sake of illustration, those skilled in the art will appreciate numerous modifications and variations therefrom. It is intended that the appended claims cover all such modifications and variations as fall within the true spirit and scope of this present invention.

What is claimed is:

1. An apparatus comprising:
  a delay sensor to provide a delay based on a processing delay of at least one gated circuit;

a phase detector to provide a digital control signal based at least in part on the delay;

a signal averager to obtain an averaged control signal by smoothing the digital control signal provided by the phase detector; and a transistor to provide a local power voltage to the at least one gated circuit based on the averaged control signal, wherein a control gate of the transistor is to receive the averaged control signal provided by the signal averager.

2. The apparatus of claim 1, wherein an output terminal of the signal averager is directly coupled to the control gate of the transistor.

3. The apparatus of claim 1, wherein the signal averager comprises a resistor-capacitor low-pass filter.

4. The apparatus of claim 1, wherein the signal averager is to perform a moving average of the digital control signal.

5. The apparatus of claim 1, further comprising a power filter to filter the local power voltage.

6. The apparatus of claim 1, further comprising a mode selector to select one of a plurality of operating modes.

7. The apparatus of claim 6, wherein the plurality of operating modes comprises a bypass mode, a gating mode, and an adaptive mode.

8. The apparatus of claim 1, wherein the delay sensor comprises N inverters to model a logic depth of the at least one gated circuit.

9. The apparatus of claim 8, wherein each of the N inverters is a tri-state inverter with a control input coupled to the local power voltage.

10. The apparatus of claim 1, wherein the delay sensor comprises a level shifter to convert a signal level from the local power voltage to a global power voltage.

11. The apparatus of claim 1, wherein the phase detector is to provide the digital control signal based on comparison of the delay to a reference clock period.

12. A system comprising:
a system on a chip comprising at least one core having at least one execution unit and power control logic, the power control logic comprising:
a delay sensor to provide a delay for at least one gated circuit based on a local power voltage;
a phase detector to provide a digital control signal based at least in part on the delay;
a signal averager to obtain an averaged control signal by smoothing the digital control signal provided by the phase detector; and
a transistor to provide the local power voltage based on the averaged control signal, wherein a control gate of the transistor is to receive the averaged control signal provided by the signal averager; and
the at least one gated circuit powered by the local power voltage.

13. The system of claim 12, further comprising a multiplexer to select an operating mode of the power control logic.

14. The system of claim 12, wherein the signal averager is a low-pass filter.

15. The system of claim 12, wherein the phase detector further comprises at least two flip-flops.

16. The system of claim 15, wherein the phase detector comprises an exclusive or (XOR) gate, wherein the inputs of the XOR gate is coupled to each output of the at least two flip-flops.

17. The system of claim 12, wherein the transistor is to vary the local power voltage in inverse proportion to the averaged control signal.

18. The system of claim 12, wherein the control gate of the transistor is directly coupled to an output terminal of the signal averager.

19. A method comprising:
determining, using a delay circuit, a delay to model an operating delay of a gated circuit operating at a local power voltage;
determining a digital phase signal based on the delay and a reference clock signal;
averaging the digital phase signal to obtain an averaged phase signal; and
regulating the local power voltage via a transistor having a control gate to receive the averaged phase signal.

20. The method of claim 19, wherein determining the digital phase signal comprises providing a high value of the digital phase signal when the delay is longer than a period of the reference clock signal, the high value of the digital phase signal indicating a need to increase the local power voltage.

21. The method of claim 19, wherein determining the digital phase signal comprises providing a low value of the digital phase signal when the delay is shorter than a period of the reference clock signal, the low value of the digital phase signal indicating a need to decrease the local power voltage.

22. The method of claim 19, wherein the reference clock signal is based on at least one operating gear of a data interface protocol.

23. The method of claim 19, further comprising gating the local power voltage via the transistor in a gating mode, and providing the local power voltage via the transistor in a bypass mode.

24. The method of claim 19, further comprising variably adjusting, via the transistor in an adaptive mode, the local power voltage responsive to the averaged phase signal to regulate the local power voltage.

25. An apparatus comprising:
a gated interface circuit to process signals conforming to the Mobile Industry Processor Interface (MIPI) M-PHY Specification;
a delay sensor to provide a delay based on a processing delay of the gated interface circuit;
a phase detector to provide a digital control signal based at least in part on the delay;
a signal averager to obtain an averaged control signal by smoothing the digital control signal provided by the phase detector; and
a transistor to provide a local power voltage to the gated interface circuit based on the averaged control signal, wherein a control gate of the transistor is to receive the averaged control signal provided by the signal averager.

26. The apparatus of claim 25, further comprising a radio transceiver.

27. The apparatus of claim 25, wherein the apparatus is at least a portion of a wireless communication device.

* * * * *